United States Patent

Maley et al.

[11] Patent Number: 5,969,542
[45] Date of Patent: Oct. 19, 1999

[54] HIGH SPEED GATE OXIDE PROTECTED LEVEL SHIFTER

[75] Inventors: Reading Maley, Stanford; Albrecht Schoy, San Jose, both of Calif.

[73] Assignee: Advanced Micro Devices, Inc., Sunnyvale, Calif.

[21] Appl. No.: 08/861,038

[22] Filed: May 21, 1997

[51] Int. Cl.⁶ .................. H03K 19/0185; H03K 19/017
[52] U.S. Cl. .................. 326/81; 326/17; 326/68
[58] Field of Search .................. 326/17, 68, 80–81, 326/83, 121; 327/374

[56] References Cited

U.S. PATENT DOCUMENTS

| | | | |
|---|---|---|---|
| 4,305,009 | 12/1981 | Miyagawa et al. | 326/17 |
| 5,243,236 | 9/1993 | McDaniel | 326/68 |
| 5,391,939 | 2/1995 | Nonaka | 326/121 |
| 5,539,334 | 7/1996 | Clapp, III et al. | 326/68 |

FOREIGN PATENT DOCUMENTS 4-42612  2/1992  Japan ..................... 326/68

*Primary Examiner*—Jon Santamauro
*Attorney, Agent, or Firm*—David Chin

[57] ABSTRACT

An improved gate oxide protected level shifter is provided which has a higher speed of operation than is traditionally available. The level shifter includes a first capacitor coupled between a first output terminal and the input of an inverter and a second capacitor coupled between a first node and the output of the inverter. As a result, the speed of the transitions at the gates of the pair of cross-coupled P-channel MOS transistors is increased several times.

9 Claims, 2 Drawing Sheets

HIGH SPEED GATE OXIDE PROTECTED LEVEL SHIFTER

BACKGROUND OF THE INVENTION

This invention relates generally to level shifter circuitry and more particularly, it relates to a gate oxide protected level shifter which has a higher speed of operation than is traditionally available.

As is generally well-known, digital logic circuits are widely used in the areas of electronics and computer-type equipment. However, the various digital logic circuits that must communicate with one another may have different power supply voltages. For example, a first circuit that operates with logic levels between 0V (L) and 2.0V (H) may need to communicate with a second circuit that operates with logic levels between 0V (L) and 3.3V (H). Thus, when a first digital logic circuit of one power supply voltage is required to interface with a second digital logic circuit of another power supply voltage there is typically needed a voltage conversion or translation between the two different power supplies so that they will be compatible with each other and not drain static current. A level shifter circuit is provided to perform this function.

In FIG. 1, there is shown a schematic circuit diagram of a prior art level shifter 2 which may be used for performing a voltage conversion. The level shifter 2 is comprised of a pair of cross-coupled P-channel MOS transistors P1 and P2, a pair of input N-channel MOS transistors N1 and N2, and a CMOS inverter I1. The first P-channel transistor P1 has its source connected to an upper predetermined I/O buffer power supply voltage VDDIO, which is typically at +3.3 volts, and its drain connected to the drain of the first N-channel transistor N1 and to the gate of the second P-channel transistor P2. The gate of the first P-channel transistor P1 is connected to the drain of the second P-channel transistor P2 and to the output terminal OUT. The second P-channel transistor P2 has its source also connected to the power supply voltage VDDIO. The drain of the transistor P2 is connected also to the output terminal OUT and to the drain of the second N-channel transistor N2. The gate of the transistor P2 is connected to the drain of the transistor P1 and to the drain of the transistor N1.

The gate of the first N-channel transistor N1 is connected to an input terminal IN for receiving an input signal and to the input of the inverter I1. The output of the inverter I1 is connected to the gate of the second N-channel transistor N2. The sources of the N-channel transistors N1 and N2 are connected to a lower predetermined or reference power supply voltage VSSIO (ground) or 0 volts. The CMOS inverter is conventional and is formed of a P-channel transistor and an N-channel transistor whose gates are connected together defining its input and whose drains are connected together defining its output. The source of the P-channel inverter transistor is connected to a supply potential VDD. The p-type substrate of the N-channel transistors N1, N2 is tied to ground, and the n-type substrate of the P-channel transistors P1, P2 is tied to the power supply voltage VDDIO.

In operation, when then input signal at the input terminal IN is at 0 volts the transistors N1 and P2 will both be turned OFF and the transistors N2 and P1 will be turned ON. As a result, the level shifter 2 will produce a voltage level of 0 volts at the output terminal OUT. On the other hand, when the input signal at the input terminal IN is at 2.0 volts, the transistors N1 and P2 will both be turned ON and the transistors N2 and P1 will be turned OFF. Thus, the level shifter 2 will provide a voltage level of +3.3 volts at the output terminal OUT.

However, in view of the developments made in CMOS technologies the thickness of the transistor gate oxides for forming the CMOS transistor devices are becoming thinner and thinner. In the typical semiconductor process, where the thickness of the gate oxide is reduced to approximately 60 Å (angstrom) or below a voltage difference higher than about +2.4 volts–+2.5 volts applied across the gate and the bulk of the transistor devices will cause a breakdown in the gate oxide to occur, thereby resulting in a failure. For example, when the input signal of 0 V is applied to the gate of the first input N-channel transistor N1 the level shifter 2 of FIG. 1 will generate a voltage level of 0 V at the output terminal OUT. As can be seen, a voltage difference of 3.3 V will exist between the drains and the gates of the P-channel transistors P1, P2. Therefore, if the gate oxide thickness is equal to or lower than 60 Å the gate oxide will experience a breakdown and the level shifter 2 will fail. In order to overcome this problem, there have been provided in the prior art gate oxide protected level shifter circuits utilizing a plurality of PMOS and NMOS transistors so as to limit the voltage difference at the gate oxide to be below a breakdown voltage magnitude.

In FIG. 2, there is illustrated a schematic circuit diagram of a prior art gate oxide protected level shifter 4. The level shifter 4 is also comprised of a pair of cross-coupled P-channel MOS transistors P1, P2; a pair of input N-channel transistors N1, N2; and a CMOS inverter I1 which are identical to the components in the level shifter 2 of FIG. 1. In addition to these components, the level shifter 4 of FIG. 2 further includes PMOS transistors P3, P4 and NMOS transistors N3, N4 which function to prevent the gate oxide voltage of any transistor from exceeding a breakdown voltage. If the thickness of the gate oxides is assumed to be approximately 60 Å, then the voltage difference at any gate oxide of the level shifter 4 will not exceed approximately +2.5 V.

The PMOS transistor P3 and the NMOS transistor N3 are connected together in series and between the drain of the transistor P1 (node S1) and the drain of the transistor N1 (node S2). Similarly, the PMOS transistor P4 and the NMOS transistor N4 are connected together in series and between the drain of the transistor P2 (node S3) and the drain of the transistor N2 (node S4). The gates of the transistors P3, P4 are connected to a PMOS reference voltage VREF11, and the gates of the transistors N3, N4 are connected to an NMOS reference voltage VREF22. The reference voltages REF22 and REF11 can be generated by a reference voltage generation circuit which is illustrated and described in detail in co-pending application Ser. No. 08/861,039 filed on May 21, 1997 entitled "Reference Voltage Generation Scheme for Gate Oxide Protected Circuits" and assigned to the same assignee as the present invention.

It is assumed that the upper predetermined I/O buffer power supply voltage VDDIO is on the order of +3.3 V and the lower predetermined power supply voltage VSSIO is on the order of 0 V. Further, the reference voltage VREF22 is approximately +2.2 V and the reference voltage VREF11 is approximately +1.1 V. The supply potential VDD is on the order of +2.0 volts. It will be noted that there is required a predetermined amount of time for the input signal on the input terminal IN to switch from an initial voltage level of +2.0 V (or 0 V) to a final voltage level of 0 V (or +2.0 V). In response to this switching operation on the input terminal, there will be required a predetermined amount of time for the pper non-inverted output signal OUT_LSP and the upper inverted output signal OUTB_LSP at the respective nodes S3 and S1 to switch from an initial voltage level of VDDIO (or VREF11+$|V_{tp}|$) and a final voltage of VREF11+ $|V_{tp}|$ (or VDDIO). Likewise, there will be required a predetermined amount of time for the lower non-inverted output signal OUT_LSN and the lower inverted output signal OUTB_LSN at the respective nodes S4 and S2 to switch from an initial voltage of VREF22-$V_{tn}$ (or VSSIO) and a final voltage of VSSIO (or VREF22-$V_{tn}$).

The level shifter 4 suffers from the disadvantage that it takes a relatively long time for the nodes S1 and S3 to switch between its initial voltages and its final voltages in response to the switching of the input signal. This is due to the fact that the nodes S1 and S3 are required to be pulled down through three transistors. For example, the node S1 is serially connected to the transistors P3, N3 and N1. Similarly, the node S3 is serially connected to the transistors P4, N4 and N2. In view of this, it can therefore take a relatively long period of time for the gates of the transistors P1 and P3 to resolve their "full" logic levels of VDDIO (H) and VREF11+$|V_{tp}|$ (L).

The inventors of the present invention have developed a way of increasing the switching speeds at the gates of the transistors P1 and P3 (nodes S1 and S3) in the level shifter 4 of FIG. 2. This is achieved by modifying the level shifter 2 so as to include first and second capacitors operatively interconnected for speeding up transitions at the gate of the transistors P1 and P2.

SUMMARY OF THE INVENTION

Accordingly, it is a general object of the present invention to provide an improved gate oxide protected level shifter which has a higher speed of operation than is traditionally available.

It is an object of the present invention to provide a high speed gate oxide protected level shifter.

It is another object of the present invention to provide an improved gate oxide protected level shifter which includes capacitor means for speeding up transitions at its output terminals.

It is still another object of the present invention to provide a high speed gate oxide protected level shifter which includes a first capacitor coupled between a first output terminal and its input terminal and a second capacitor coupled between its first node and the output of the inverter.

In a preferred embodiment of the present invention, there is provided a high speed gate oxide protected level shifter which includes an input node for receiving an input signal having first and second levels, a first output terminal for providing an upper non-inverted output signal having third and fourth levels, and a second output terminal for providing a lower non-inverted output signal having fifth and sixth levels. A first I/O buffer power supply voltage has an upper voltage level, and a second I/O buffer power supply voltage has a lower voltage level.

There is provided a pair of first and second MOS transistors. The first MOS transistor has its source connected to the first I/O power supply voltage, its drain connected to the gate of the second MOS transistor at a first node, and its gate connected to the first output terminal. The second MOS transistor has its source also connected to the first I/O power supply voltage and its drain connected also to the first output terminal and to the gate of the first MOS transistor. There is also provided a pair of third and fourth MOS transistors. The third MOS transistor has its drain connected to a second node, its source connected to the second I/O power supply voltage, and its gate connected to the input node. The fourth MOS transistor has its drain connected to the second output terminal and its source connected also to the second I/O power supply voltage. An inverter has its input connected to the input node and its output connected to the gate of the fourth MOS transistor.

Fifth and sixth MOS transistors are serially connected and between the first node and the second node. The gate of the fifth transistor is connected to a first reference voltage, and the gate of the sixth MOS transistor is connected to a second reference voltage. Seventh and eighth MOS transistors are connected in series and between the first output terminal and the second output terminal. The gate of the seventh MOS transistor is connected also to the first reference voltage, and the gate of the eighth MOS transistor is connected also to the second reference voltage. A first capacitor is coupled between the first output terminal and the input of the inverter. A second capacitor is coupled between the first node and the output of the inverter.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
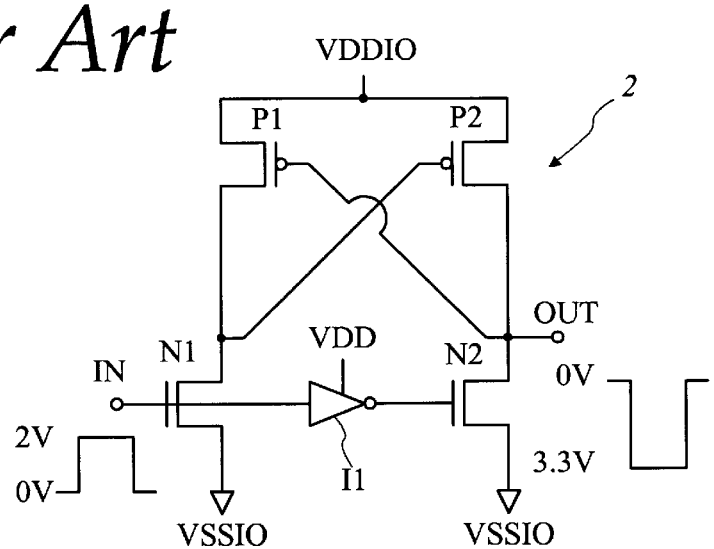
FIG. 1 is a schematic circuit diagram of a prior art level shifter.
Figure 2:
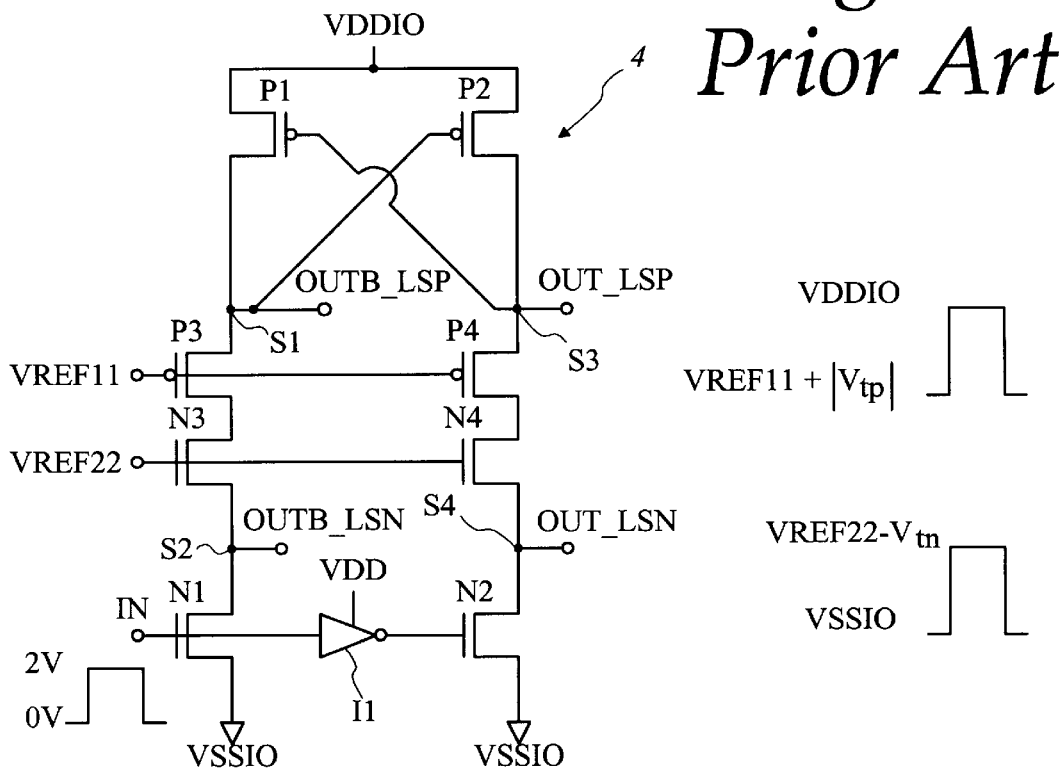
FIG. 2 is a schematic circuit diagram of a prior art gate oxide protected level shifter.
Figure 3:
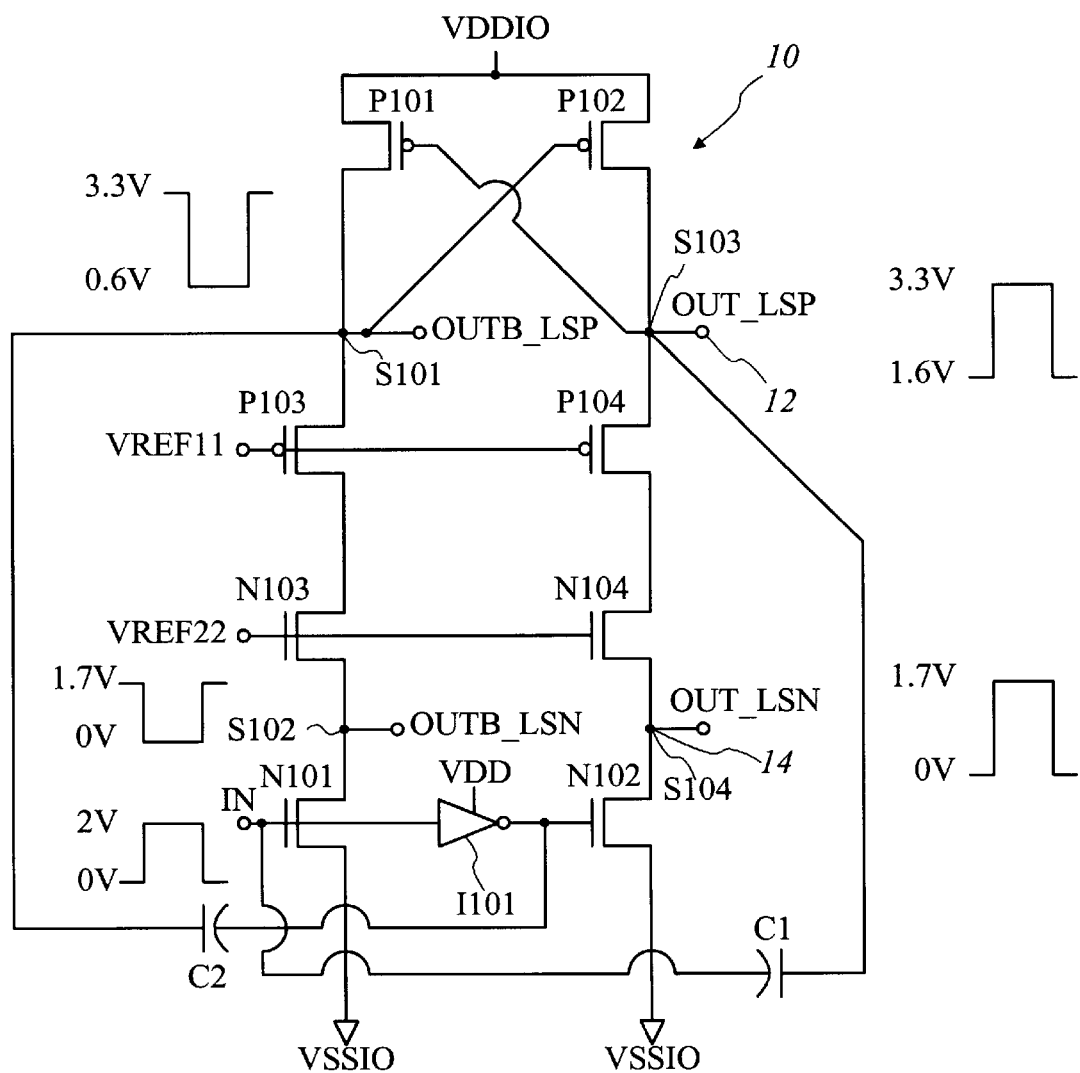
FIG. 3 is a schematic circuit diagram of a high speed gate oxide protected level shifter, constructed in accordance with the principles of the present invention.

Referring now to FIG. 3 of the drawings, there is shown a schematic circuit diagram of a high speed, gate oxide protected level shifter 10 constructed in accordance with the principles of the present invention. The level shifter 10 is used to convert logic signals from a core device (i.e., microprocessor) having voltage levels of high and low (2 volts and 0 volts) to higher input/output (I/O) voltage levels of 3.3 V and 0 V. The level shifter 10 represents an improvement over the level shifter 4 of FIG. 2 and has an operating speed which is several times faster.

The level shifter 10 is comprised of a pair of cross-coupled P-channel MOS transistors P101 and P102; a pair of N-channel input transistors N101 and N102; and a CMOS inverter I101. The first P-channel MOS transistor P101 has its source connected to an upper predetermined I/O buffer power supply voltage VDDIO, which is typically at +3.3 volts but is variable between +2.0 V and +3.6 V. The drain of the first P-channel transistor P101 is connected to the gate of the second P-channel transistor P102 and to a node S101 for providing an upper inverted output signal OUTB_LSP. The gate of the transistor P101 is connected to the gate of the transistor P102 and to an output terminal 12 at node S103 for providing an upper non-inverted output signal OUT_LSP. Similarly, the second P-channel transistor P102 has its source connected also to the power supply voltage VDDIO. The drain of the transistor P102 is connected also to the node S103. The gate of the transistor P102 is connected to the drain of the transistor P101 at the node S101.

The drain of the first N-channel transistor N101 is connected to a node S102 for providing a lower inverted output signal OUTB_LSN. The drain of the second N-channel transistor N102 is connected to an output terminal 14 at node S104 for providing a lower non-inverted output signal OUT_LSN. The gate of the first N-channel transistor N101 is connected to an input terminal IN for receiving an input signal and to the input of the inverter I101. The output of the inverter I101 is connected to the gate of the transistor N102. The sources of the transistors N101 and N102 are connected to a lower predetermined or reference power supply voltage VSSIO (ground) or 0 volts. The inverter I101 is a conventional CMOS inverter and is formed of a P-channel transistor and an N-channel transistor whose gates are connected together defining its input and whose drains are connected together defining its output. The source of the P-channel inverter transistor is connected to a power supply potential VDD, which is on the order of +2.0 V.

The level shifter 10 further includes PMOS transistors P103, P104 and NMOS transistors N103, N104 which function to prevent the gate oxide voltage of any transistor from exceeding a breakdown voltage. If the thickness of the gate oxide is assumed to be less than approximately 60 Å, then the voltage difference at any gate oxide of the level shifter 10 will not exceed approximately +2.5 V. The PMOS transistor P103 and the NMOS transistor N103 are connected together in series and between the drain of the transistor P101 (node S101) and the drain of the transistor N101 (node S102). Similarly, the PMOS transistor P104 and the NMOS transistor N104 are connected together in series and between the drain of the transistor P102 (node S103) and the drain of the transistor N102 (node S104).

In particular, the source of the transistor P103 is connected to the drain of the transistor P101 and to the gate of the transistor P102 at the node S101. The drain of the transistor P103 is connected to the drain of the transistor N103. The source of the transistor N103 is connected to the drain of the transistor N101 at the node S102. The source of the transistor P104 is connected to the drain of the transistor P102 and to the gate of the transistor P101 at the node S103. The drain of the transistor P104 is connected to the drain of the transistor N104. The source of the transistor N104 is connected to the drain of the transistor N102 at the node S104. The gates of the transistors P103, P104 are connected to a PMOS reference voltage VREF11, and the gates of the transistors N103, N104 are connected to an NMOS reference voltage VREF22. The reference voltages VREF22 and VREF11 can be generated by the reference voltage generation circuit in the aforementioned Ser. No. 08/861,039. The voltage VREF22 is approximately +2.2 V and the reference voltage VREF11 is approximately +1.1 V.

The p-type substrate of the NMOS transistors N101–N104 is tied to the reference power supply voltage VSSIO, and the n-type substrate of the PMOS transistors P101–P104 is tied to the upper predetermined I/O buffer power supply voltage VDDIO. The values of the threshold voltages $V_{tn}$, including the body effect, of the NMOS transistors N101–N104 are equal to approximately 0.5 V. The absolute values of the threshold voltages $V_{tp}$, including the body effect, of the PMOS transistors P101–P104 are also equal to approximately 0.5 volts. When the input signal at the input terminal IN switches between 2.0 V and 0 V, the upper non-inverted output signal OUT_LSP at the node S103 and the upper inverted output signal OUTB_LSP will be switched between 3.3 V and 1.6 V. Also, as the input signal switches, the lower non-inverted output signal OUT_LSN at the node S104 and the lower inverted output signal OUTB_LSN at the node S102 will be switched between 0 V and 1.7 V.

In order to speed up the transitions at the gate of the transistor P101 (node S101) and at the gate of the transistor P102 (node S103) in response to the switching of the input signal, a first coupling capacitor C1 and a second coupling capacitor C2 are provided. One end of the capacitor C1 is connected to the node S103 and its other end is connected to the gate of the transistor N101 at the input terminal IN. One end of the capacitor C2 is connected to the node S101 and its other end is connected to the gate of the transistor N102 at the output of the inverter I101. The capacitors C1 and C2 function to speed up the transitions at the nodes S101 and S103 by coupling the fast-switching input and output of the inverter I101 to the gates of the transistors P101 and P102. As a result, the level shifter 10 of FIG. 3 is capable of operating several times faster than the level shifter 4 of FIG. 2.

When the input signal makes the transition from 2 V to 0 V, the operation of the level shifter 10 will now be described. This high-to-low transition at the input terminal IN will be inverted by the inverter I101 and capacitively coupled via capacitor C2 to the gate of the transistor P102 so as to immediately turn OFF the transistor P102. As a result, the output signal OUT_LSP at the node S103 will quickly fall to 1.6 V. Simultaneously, the transistor N102 will be turned ON and the output signal OUT_LSN at the node S104 will quickly fall down to 0 V. Further, with the output signal OUT_LSP falling toward 1.6 V, this will, in turn, cause the transistor P101 to turn ON and the output signal OUTB_LSP at the node S101 will rise quickly to +3.3 V so as to assist in turning off the transistor P102.

When the input signal at the input terminal IN makes a transition from 0 V to 2 V, it will be capacitively coupled via capacitor C1 to the gate of the transistor P101 so as to turn OFF the transistor P101. As a result, the output signal OUTB_LSP at the node S101 will quickly fall to 1.6 V. Simultaneously, the transistor N101 will be turned ON and the output signal OUTB_LSN at the node S102 will quickly fall down to 0 V. Further, with the output signal OUTB_LSP falling toward 1.6 V, this will, in turn, cause the transistor P102 to turn ON and the output signal OUT_LSP at the node S103 will rise quickly to +3.3 V so as to further turn off the transistor P101.

From the foregoing detailed description, it can thus be seen that the present invention provides an improved gate oxide protected level shifter which has a higher speed of operation. The level shifter of the present invention includes a first capacitor coupled between a first output terminal and the input of an inverter and a second capacitor coupled between a first node and the output of the inverter. As a result, the output transitions of the level shifter have a higher speed of operation in response to the switching of an input signal.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

We claim:

1. A high speed gate oxide protected level shifter comprising:

an input node for receiving an input signal having first and second levels;

a first output terminal for providing an upper non-inverting output signal having third and fourth levels;

a second output terminal for providing a lower non-inverting output signal having fifth and sixth levels;

a first I/O buffer power supply voltage having an upper voltage level;

a second I/O buffer power supply voltage having a lower voltage level;

a pair of first and second P-channel MOS transistors, said first MOS transistor having its source electrode connected to said first I/O power supply voltage, its drain electrode connected to the gate of said second MOS transistor at a first node, and its gate connected to said first output terminal, said second MOS transistor having its source electrode also connected to said first I/O power supply voltage and its drain electrode also connected to said first output terminal and to the gate of said first MOS transistor;

a pair of third and fourth N-channel MOS transistors, said third MOS transistor having its drain electrode connected to a second node, its source electrode connected to said second power supply voltage, and its gate connected to said input node, said fourth MOS transistor having its drain electrode connected to said second output terminal and its source electrode also connected to said second power supply voltage;

an inverter having its input connected to said input node and its output connected to the gate of said fourth MOS transistor;

fifth and sixth MOS transistors having their conduction path electrodes connected in series and between said first node and said second node, said fifth MOS transistor having its gate connected to a first reference voltage and said sixth MOS transistor having its gate connected to a second reference voltage;

seventh and eighth MOS transistors having their conduction path electrodes connected in series and between said first output terminal and said second output terminal, said seventh MOS transistor having its gate connected to the first reference voltage and said eighth MOS transistor having its gate connected to the second reference voltage;

a first capacitor coupled between the first output terminal and the input of said inverter to quickly turn off said first MOS transistor when said input signal makes a low-to-high transition; and a second capacitor coupled between the first node and the output of said inverter to quickly turn off said second MOS transistor when said input signal makes a high-to-low transition.

2. A level shifter as claimed in claim 1, wherein said first I/O buffer power supply voltage is approximately +3.3 volts.

3. A level shifter as claimed in claim 2, wherein said second I/O buffer power supply voltage is approximately zero volts.

4. A level shifter as claimed in claim 3, wherein said first and second levels are voltage levels of 0 V and 2 V.

5. A level shifter as claimed in claim 4, wherein said third and fourth levels are voltage levels of 1.6 V and 3.3 V.

6. A level shifter as claimed in claim 5, wherein said fifth and sixth levels are voltage levels of 0 V and 1.7 V.

7. A level shifter as claimed in claim 1, wherein said, fifth and seventh MOS transistors are P-channel transistors.

8. A level shifter as claimed in claim 7, wherein said, sixth and eighth transistors are N-channel transistors.

9. A level shifter as claimed in claim 1, wherein said inverter is a CMOS inverter formed of a P-channel transistor and an N-channel transistor.

* * * * *

UNITED STATES PATENT AND TRADEMARK OFFICE
CERTIFICATE OF CORRECTION

PATENT NO : 5,969,542
DATED : October 19, 1999
INVENTOR(S): 5,969,542

It is certified that error appears in the above-identified patent and that said Letters Patent is hereby corrected as shown below:

Column 2, line 67, cancel "pper", insert therefor --upper-- .

Signed and Sealed this

Eleventh Day of April, 2000

Attest:

Q. TODD DICKINSON

Attesting Officer

*Director of Patents and Trademarks*